United States Patent [19]
Thomas

[11] Patent Number: 5,904,507
[45] Date of Patent: May 18, 1999

[54] PROGRAMMABLE ANTI-FUSES USING LASER WRITING

[75] Inventor: Michael E. Thomas, Milpitas, Calif.

[73] Assignee: National Semiconductor Corporation, Santa Clara, Calif.

[21] Appl. No.: 09/028,190

[22] Filed: Feb. 23, 1998

[51] Int. Cl.[6] .................................................. H01L 21/82
[52] U.S. Cl. .......................................... 438/131; 438/128
[58] Field of Search ...................................... 438/131, 128

[56] References Cited

U.S. PATENT DOCUMENTS

| 5,110,754 | 5/1992 | Lowrey et al. | 438/131 |
| 5,700,722 | 12/1997 | Sumz | 438/649 |
| 5,763,299 | 6/1998 | McCollum et al. | 438/131 |

*Primary Examiner*—Kevin M. Picardat
*Assistant Examiner*—Devon Collins
*Attorney, Agent, or Firm*—Beyer & Weaver, LLP

[57] ABSTRACT

Disclosed is a method of fabricating a programmable antifuse structure wherein programming of the antifuse structure results in conducting paths which are confined within a finite predictable area. The method includes depositing an insulating layer over a field. Additionally, the method includes creating a via through a via area of the insulating layer to expose a programmable surface area of the field. The method also includes depositing an interlayer over the exposed programmable surface of the field, over sidewalls of the via, and over an extended surface region of the insulating layer, the extended surface region including the via area. The method includes depositing a first conducting layer over the interlayer. The method also includes etching in the extended surface region to the insulating layer; the etching is for confining formation of conductive paths to within the via area upon programming of the programmable antifuse structure. The method further includes depositing a second conducting layer over the via area.

17 Claims, 5 Drawing Sheets

5,904,507

PROGRAMMABLE ANTI-FUSES USING LASER WRITING

TECHNICAL FIELD

The present invention relates generally to programmable antifuses incorporated in integrated circuit devices and methods of making the same.

BACKGROUND ART

An antifuse is a device commonly used to create a programmable connection between two nodes of an integrated circuit. Antifuses are used in a wide variety of types of integrated circuits, as for example in programmable read only memory devices (PROM's), programmable logic devices (PLD's), and programmable gate array logic devices. An antifuse typically includes two conducting or semiconducting electrodes or contacts and an insulating or dielectric interlayer material that lies between the two electrodes. The initial unprogrammed condition of an antifuse is an open circuit. During programming of the antifuse, the insulating interlayer material is broken down at selected points to electrically connect the contacts together through the insulating interlayer material.

Typically, antifuse devices are programmed by electrical or optical methods. Electrical programming of antifuses of an integrated circuit device may be achieved after the integrated circuit device has been fabricated and packaged. In contrast, optical methods typically must be employed during fabrication. Current state of the art optical programming methods use high powered lasers which can rapidly write a small area at speeds of up to on the order of 1000 pulses per second. Thus, optical programming methods may allow high speed programmability.

Antifuse devices may be disposed on the surface of a semiconductor substrate of an integrated circuit. Alternatively, antifuse devices may be disposed in layers above the surface of the semiconductor substrate of the integrated circuit. For example, metal to metal antifuse devices are commonly used to create programmable links between two metal interconnect layers in an integrated circuit. Metal to metal antifuses typically include an interlayer of amorphous silicon disposed between first and second layers of refractory metals.

FIG. 1 shows a typical prior art antifuse device 100. Antifuse device 100 includes a field 102. Field 102 provides a first programmable contact of antifuse device 100. Field 102 may be a metal interconnect, a gate of a transistor, or any other conducting or semiconducting material. A dielectric layer 104 is generally formed over the field 102 to electrically insulate the field 102 from subsequently deposited conducting structures. The dielectric layer 104 is typically formed from silicon dioxide ($SiO_2$) or another appropriate insulating material. Vias 106 are then typically etched into the dielectric layer 104.

After the vias are formed, an insulating or dielectric interlayer 110 is conformally deposited over the wafer surface thereby covering the bottom and sidewalls of via 106. The antifuse interlayer 110 is typically formed from either amorphous silicon or polysilicon. A conducting layer 114 is then deposited over the insulating interlayer 110. The conducting layer 114 provides a second programmable contact of the antifuse device 100. The conducting layer 114 is typically formed from a refractory metal such as, for example, titanium (Ti), tungsten (W), tantalum (Ta), or molybdenum (Mo). Refractory metals form silicides with silicon in a reaction known as silicidation which is further described below. A conducting plug material 116 is formed over the conducting layer 114 to fill in the via 106. The conductive plug material 116 is typically formed from a metal.

During electrical or optical programming of the antifuse device 100, metal atoms from the conducting layer 114 and the field 102 are diffused into the insulating interlayer 110 to form conducting paths 118. For example, if the antifuse device 100 is a metal to metal antifuse utilizing amorphous silicon for the insulating interlayer 110 and a refractory metal for the conducting layer 114, thermal energy generated by electrical or optical energy results in silicides forming in the insulating interlayer 110, which silicides form conducting paths 118 between the field 102 and conducting layer 114. A silicide of a metal is formed when metal is alloyed on a silicon surface. Alloying causes inter-diffusion of the metal and the silicon surface.

A problem with conventional antifuse device 100 is that the conductive paths 118 formed through the insulating interlayer 110 are not confined to the via region 108. Conductive paths 118 may also be formed outside of via region 108 in a crawl-out region 112. Therefore, the silicidation reaction may not be localized. Conductive paths formed in crawl-out region 112 may cause degradation of performance integrity or failure of an integrated circuit which includes antifuse device 100.

What is needed is an antifuse device in which formation of conductive paths through the interlayer material is confined within a finite and predictable region. What is further needed is an antifuse device in which conductive path formation is confined to a via region of the antifuse device.

These and other advantages of the present invention will become apparent upon reading the following detailed descriptions and studying the various figures of the drawings.

SUMMARY OF THE INVENTION

Broadly speaking, the present invention fills these needs by providing an antifuse device that confines the conductive paths formed during programming to a via area. It should be appreciated that the present invention can be implemented in numerous ways, including as a process, an apparatus, a system, a device, or a method. Several inventive embodiments of the present invention are described below.

In one embodiment, a method of fabricating a programmable antifuse structure wherein programming of the antifuse structure results in conducting paths which are confined within a finite predictable area is disclosed. The method includes depositing an insulating layer over a field. Additionally, the method includes creating a via through a via area of the insulating layer to expose a programmable surface area of the field. The method also includes depositing an interlayer over the exposed programmable surface of the field, over sidewalls of the via, and over an extended surface region of the insulating layer, the extended surface region including the via area. The method includes depositing a first conducting layer over the interlayer. The method also includes etching in the extended surface region to the insulating layer; the etching is for confining formation of conductive paths to within the via area upon programming of the programmable antifuse structure. The method further includes depositing a second conducting layer over the via area.

Advantageously, the embodiments of the present invention allow confinement of the conductive paths formed between the interlayer and the field to the via area.

Additionally, since the interlayer does not extend out of the via area, crawl out of the interlayer during programming is substantially eliminated. As a result of these and other advantages, substantial increases in performance integrity may be achieved for an integrated circuit that includes an antifuse of the present invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

In the following description, numerous specific details are set forth in order to provide a thorough understanding of the present invention. However, as will be apparent to those skilled in the art, the present invention may be practiced without some or all of these specific details. In other instances, well known process steps have not been described in detail in order not to unnecessarily obscure the present invention.

Figure 1:
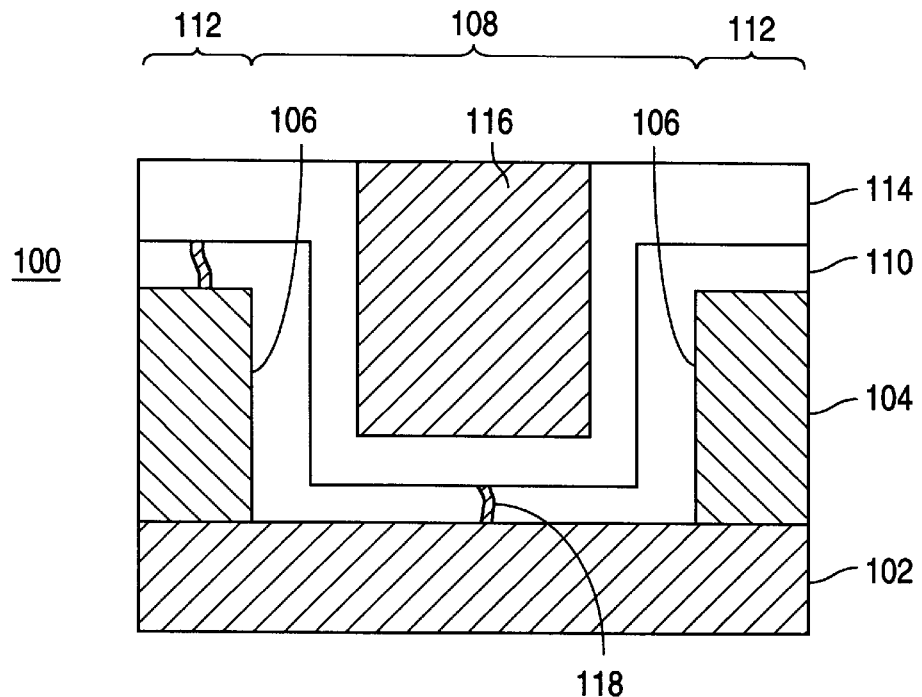
FIG. 1 illustrates a cross-section view of a typical prior art antifuse device.
Figure 2:
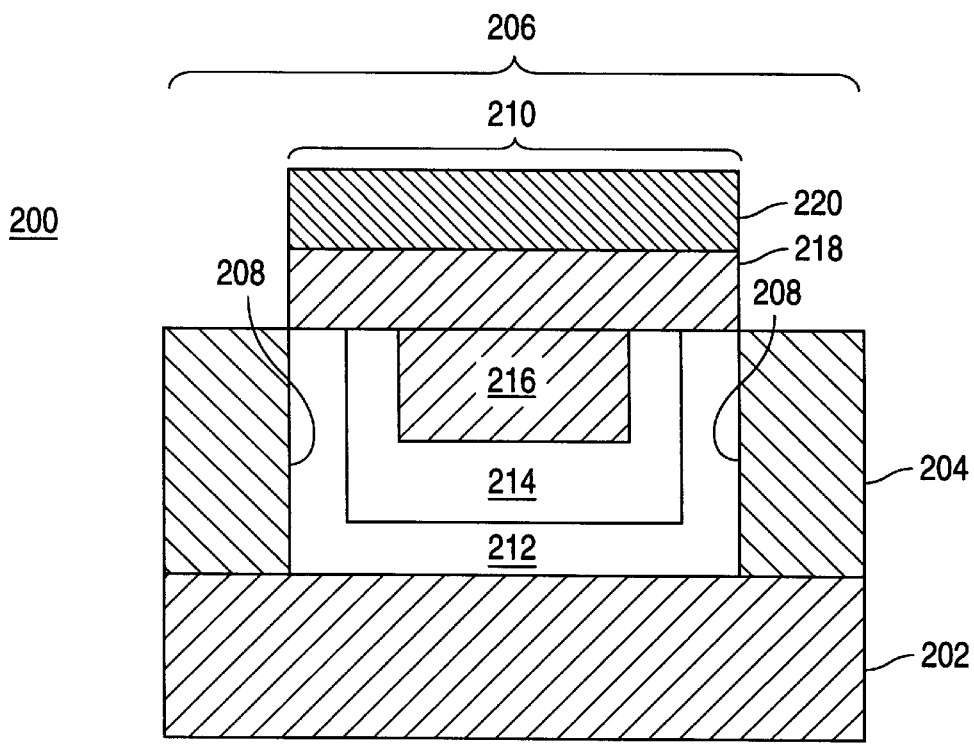
FIG. 2 illustrates a cross-section view of a antifuse structure in accordance with principles of the present invention.

FIG. 2 illustrates a cross-section view of an antifuse structure 200 in accordance with one embodiment of the present invention. As shown, the antifuse structure 200 includes a field 202. An insulating layer 204 having a via 208 is positioned over the field 202. The via 208 of the insulating layer 204 includes an interlayer 212, a conducting layer 214, and a plug 216. A barrier layer 218 and interconnect 220 are positioned over the via 208 of the insulating layer 204.

The field 202 serves as a first programmable contact of antifuse structure 200. In various embodiments of the present invention, the structure and composition of the field 202 may vary. As examples, the field 202 may be a semiconductor substrate, a gate of a transistor, a metal interconnect, a doped polysilicon electrode, or any other conducting or semiconducting elements that are suitable for forming a programmable contact of an antifuse device. The insulating layer 204 is formed over an extended surface region 206 of the field 202. The via 208 is formed through a via area 210 of the insulating layer 204 to expose a programmable contact area of the field 202. The extended surface region 206 includes the via area 210. As will be appreciated by those skilled in the art, the insulating layer 204 and the via 208 created in the insulating layer may be formed using any of a number of conventional fabrication techniques.

As shown, the interlayer 212 is disposed in the via 208 over the field 202. The interlayer 212 is formed over the programmable contact area of the field 202 and over sidewalls of the via 208. The interlayer 212 is formed from a normally nonconductive material that reacts with the conducting layer 214 upon programming of the antifuse structure 200 as explained further below. The conducting layer 214 is disposed over the interlayer 212. The conducting layer 214 serves as a second programmable contact of the antifuse structure 200.

The plug 216 is formed in a portion of the via 208 not filled by the interlayer 212 and conducting layer 214. Of course, if the conducting layer 214 completely fills the via 208, a plug is not required. A barrier layer 218 is formed over the via area 210 above the plug 216, interlayer 212, and conducting layer 214. The interconnect 220 is disposed over the barrier layer 218. The barrier layer 218 inhibits chemical reaction between the interlayer 212 and interconnect 220.

In varying embodiments of the present invention, the antifuse structure 200 may be programmed according to well known optical or electrical techniques. The antifuse structure 200 may be programmed by optical techniques before or after electrical connections are formed on the antifuse 200. For example, the antifuse 200 may be programmed by optical techniques after formation of the interconnect 220 since optical energy that is incident on the interconnect 220 is converted to thermal energy, and therefore, thermal energy reaches the interlayer 212 of the antifuse structure 200 and initiates a physical reaction between the interlayer 212 and the conducting layer 214.

Upon programming of the antifuse 200, conductive paths are formed through the interlayer 212 to couple the conducting layer 214 and field 202. These conductive paths are the result of a physical reaction between the conducting layer 214 and the interlayer 212. The specific characteristics of the physical reaction may take various forms. For example, during programming a silicide of the conducting layer 214 may form between the field 202 and the conducting layer 214. That is, portions of the conducting layer 214 inter-diffuse into the interlayer 212 in a process called salicidation.

One advantage of the antifuse structure 200 is that during programming conductive paths that are formed through the interlayer 212 are confined to the via area 210. In other words, the conductive paths are blocked by the barrier layer 218, for example, and interlayer 212 cannot chemically react with the interconnect 220.

Figure 3:
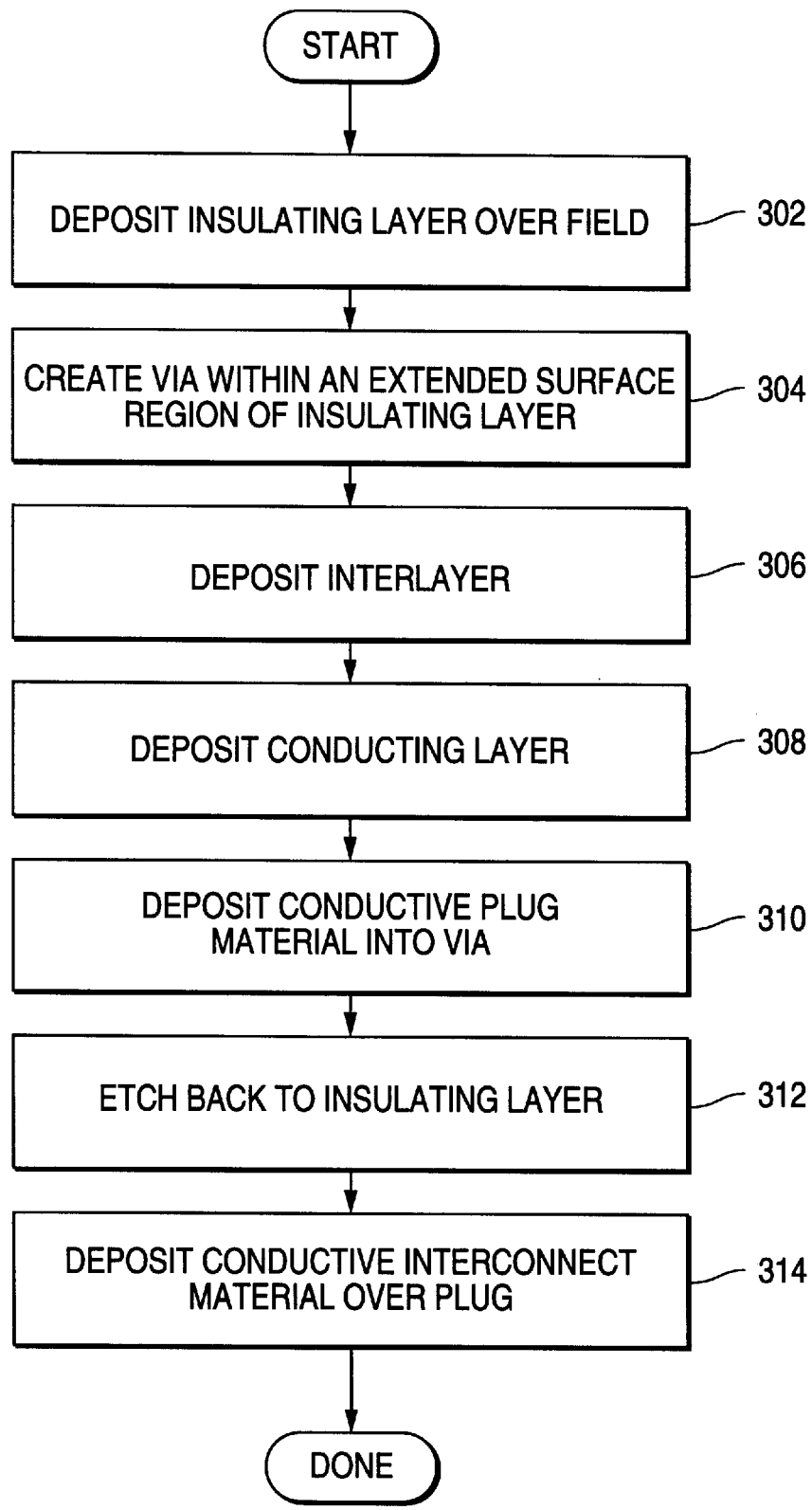
FIG. 3 is a flow diagram illustrating a process according to principles of the present invention for fabricating a programmable antifuse device in accordance with principles of the present invention.

FIG. 3 is a flow diagram illustrating a fabrication process 300 in accordance with principles of the present invention for fabricating programmable antifuse 200 (FIG. 2). Each of the steps of fabrication process 300 for creating antifuse structure 200 (FIG. 2) is illustrated in FIGS. 4A through 4E.

In step 302 of process 300, insulating layer 204 (FIG. 4A) is deposited over field 202. The insulating layer 204 ensures satisfactory insulation of subsequently deposited conducting structures from the field 202. In varying embodiments, the materials used to form the insulating layer 204 may widely vary. For example, the insulating layer 204 may be formed from silicon dioxide ($SiO_2$). In alternative embodiments, insulating layer 204 may be formed from other suitable insulating materials that may be used in antifuse devices. In step 304 of process 300 (FIG. 3), a via 208 (FIG. 4A) is created in a via area 210 through insulating layer 204 to expose the programmable contact area of field 202.

In step 306 of process 300 (FIG. 3), interlayer 212 (FIG. 4B) is deposited over extended surface region 206 of the field 202. The interlayer 212 may be formed from any suitable material that reacts with conducting layer 214. For example, the interlayer 212 may be in the form of any suitable Silicide or Germanide, such as amorphous silicon, polysilicon, or amorphous germanium.

In step 308 of process 300 (FIG. 3), conducting layer 214 (FIG. 4B) is deposited over interlayer 212. Materials used for conducting layer 214 may vary in the present invention. For example, conducting layer 214 may be formed from a refractory metal such as titanium (Ti), tungsten (W), tantalum (Ta), cobalt (Co), or molybdenum (Mo). By way of another example, the conducting layer 214 may be formed from a TiN layer that is positioned over a Ti layer. The TiN layer will serve as a barrier and prevent silicon diffusion from the field 202 into the plug 216 and interconnect 220. When the barrier layer 218 is not implemented, it is preferable to use a TiN/Ti composition for the conducting layer 214 which extends over a top interface of interlayer 212. Refractory metals form suicides with silicon in a reaction known as salicidation which takes place as a result of programming antifuse structure 200 as further described above.

In step 310 of process 300 (FIG. 3), plug 216 (FIG. 4C) is formed over the conducting layer 214. The plug 216 may be any suitably conductive material. For example, the plug 216 may be formed from aluminum (Al) or tungsten (W). Preferably, the material used for the plug 216 is the same as the material used for the conducting layer 214. Of course, the material for the plug 216 may be different from the material used for the conducting layer 214. Alternatively, an insulating material may be used for the plug 216 since a conductive path is formed through the conducting layer 214 deposed on the sidewalls of the via 308. In a preferred embodiment of the present invention, chemical vapor deposition (CVD) is used to deposit material for the plug 216, and chemical-mechanical planarization (CMP) is used to remove plug material outside of the via 208.

Figure 4A:
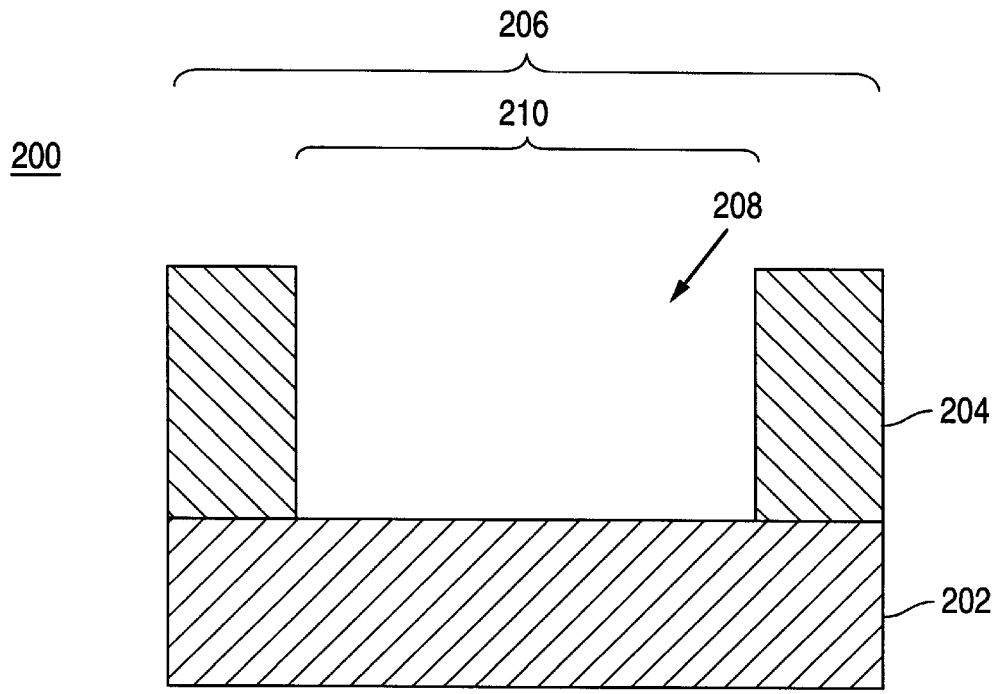
FIG. 4A illustrates a cross-section view of an insulation layer disposed above a field of an IC wherein a via is formed within the insulation layer.
Figure 4B:
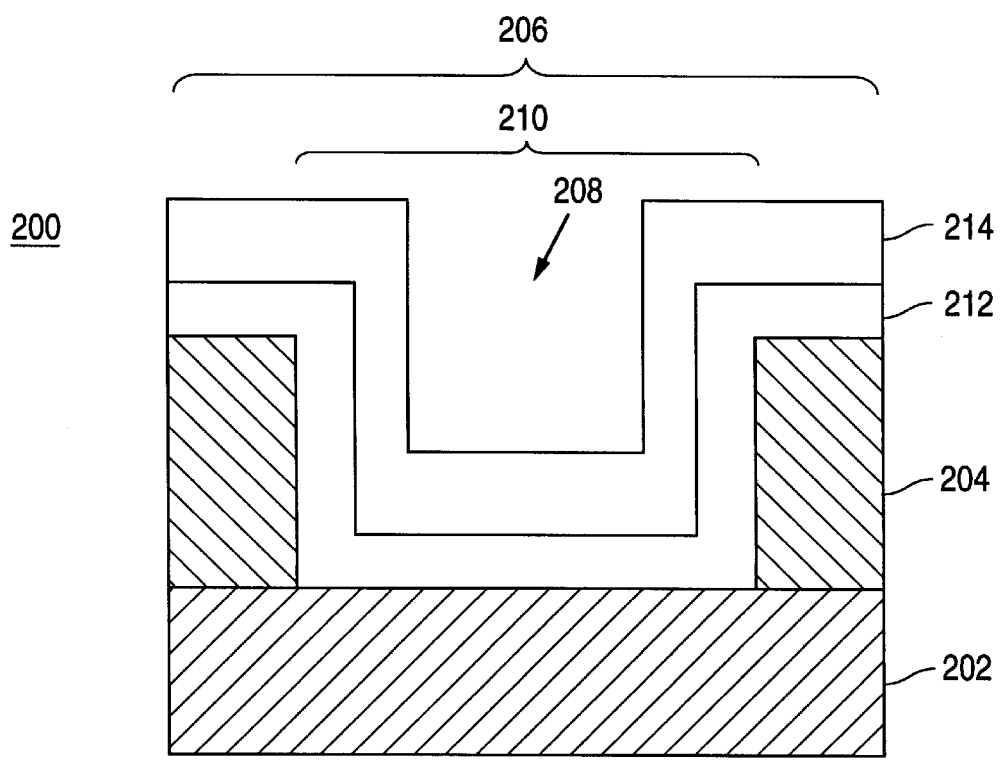
FIG. 4B illustrates a cross-section view of the structure of FIG. 4A wherein a polysilicon interlayer is disposed in the via and a first conducting layer is disposed over the polysilicon interlayer.
Figure 4C:
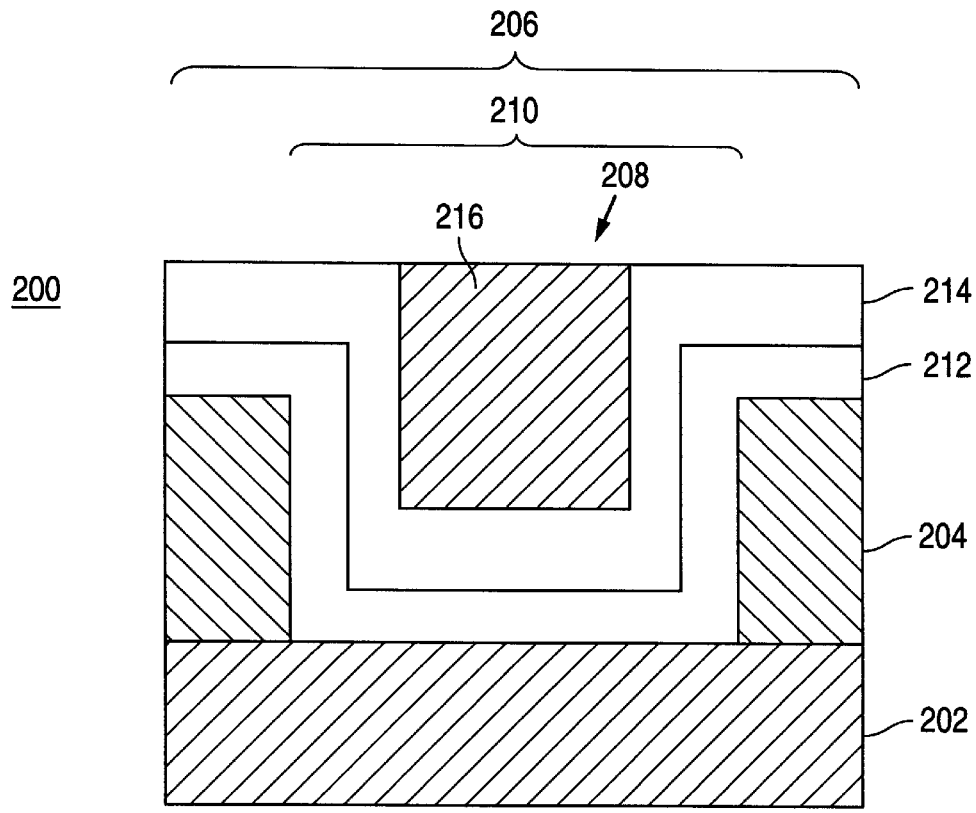
FIG. 4C illustrates a cross-section view of the structure of FIG. 4B with a plug material filling the via.
Figure 4D:
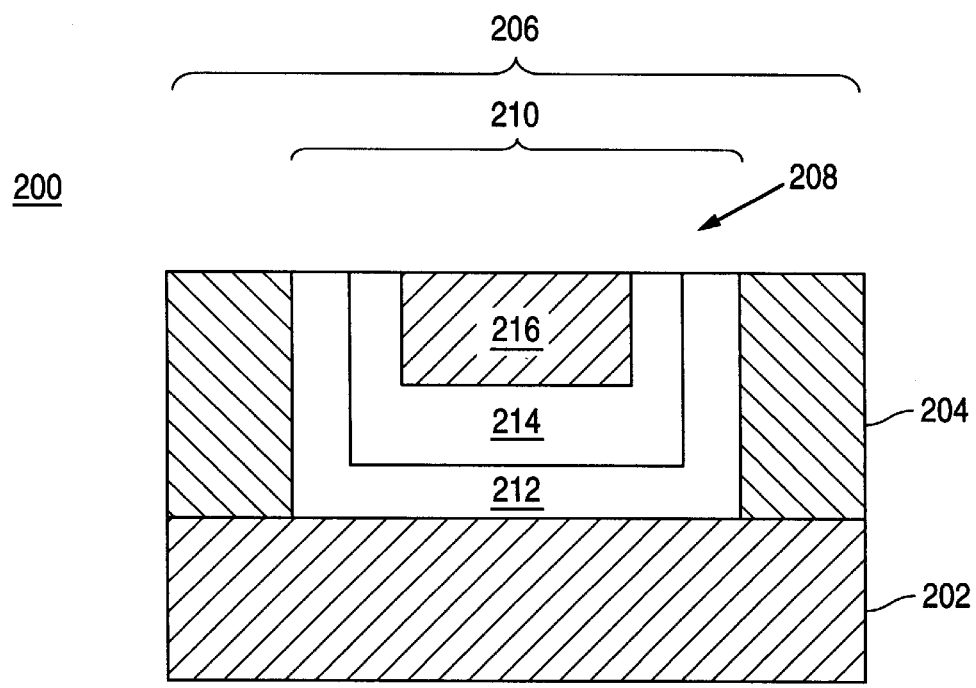
FIG. 4D illustrates a cross-section view of the structure of FIG. 4C after etching is performed in an extended surface region of the insulation layer according to principles of the present invention.
Figure 4E:
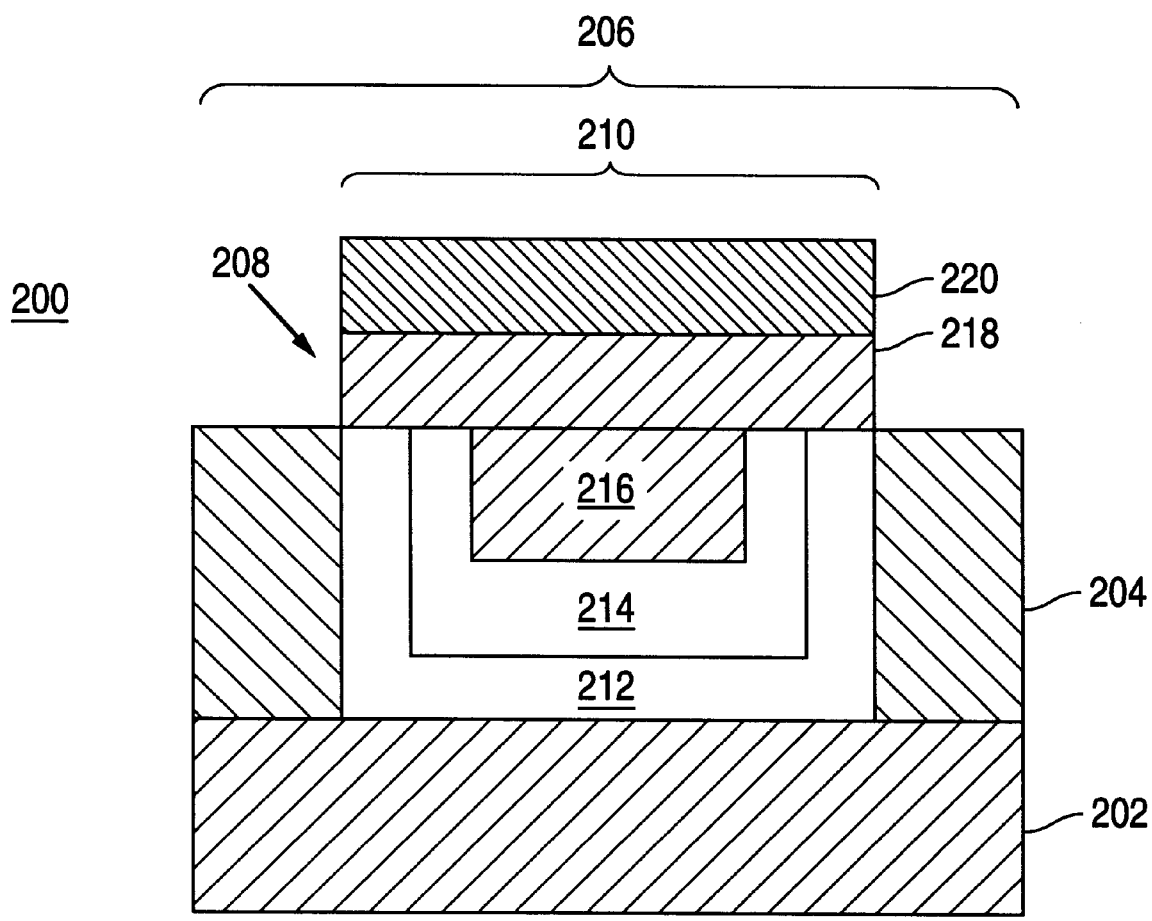
FIG. 4E illustrates a cross-section view of the structure of FIG. 4D with a barrier layer disposed over the via region and an interconnect disposed over the barrier layer.

In step 312 of process 300 (FIG. 3), etching is performed in the extended surface region 206 (FIG. 4C) of the insulating layer 204 to confine the programmable region to the via area 210. Any suitable etching technique may be implemented. For example, an anisotropic etching or a chemical-mechanical planarization process may be performed to confine the programmable region. FIG. 4D illustrates a cross-section view of the structure of FIG. 4C after etching is performed in accordance with step 312 of process 300 (FIG. 3). One advantage of etching in the extended surface region 206 is to prevent crawl-out of silicides from the via area 210 when the antifuse structure 200 is programmed.

In step 314 of process 300 (FIG. 3), an interconnect 220 (FIG. 4E) is deposited over the via area 210. In an embodiment of the present invention, barrier layer 218 may be formed between the via area 208 and the interconnect 220. The barrier layer 218 inhibits chemical reaction between the interlayer 212 and the interconnect 220. Of course, a portion of the interconnect 220 that is over the via 206 may be removed to prevent thermal damage, for example, to the interconnect 220 during programming of the programmable antifuse structure.

The embodiments of the present invention have many advantages. For example, as mentioned above the interlayer 212 is confined to the via area 210. Thus, during programming the conductive paths formed between the interlayer 212 and the field 202 are also confined to the via area. Additionally, since the interlayer 212 does not extend out of the via area 210, crawl out of the interlayer 212 during programming is substantially eliminated. As a result of these and other advantages, substantial increases in performance integrity may be achieved for an integrated circuit that includes an antifuse of the present invention.

While this invention has been described in terms of several preferred embodiments, there are alterations, permutations, and equivalents which fall within the scope of this invention. It should also be noted that there are may alternative ways of implementing both the process and apparatus of the present invention. For example, the plug 216 and the barrier layer 218 are not required; interlayer 214 may be patterned, etched, and programmed. Interconnect 220 may then be deposited over interlayer 214. It is therefore intended that the following appended claims be interpreted as including all such alterations, permutations, and equivalents as fall within the true spirit and scope of the present invention.

I claim:

1. A method of fabricating a programmable antifuse structure within an integrated circuit, the method comprising:

depositing an insulating layer over a substrate that includes a field;

creating a via in the insulating layer thereby exposing a surface of the field, the via including sidewalls;

depositing an interlayer over the insulating layer such that the interlayer coats the sidewalls of the via and the exposed surface of the field;

depositing a first conductive layer over the interlayer;

etching the interlayer and the first conductive layer to expose the insulating layer outside of the via, thereby forming isolated antifuse regions within the vias that do not substantially extend outside of the via; and depositing a second conductive layer over said via.

2. A method of fabricating a programmable antifuse structure as recited in claim 1 further comprising the step of depositing a barrier layer between said via and said second conducting layer.

3. A method of fabricating a programmable antifuse structure as recited in claim 1 wherein said interlayer is formed from amorphous polysilicon.

4. A method of fabricating a programmable antifuse structure as recited in claim 1 wherein said first conducting layer is formed from a refractory metal.

5. A method of fabricating a programmable antifuse structure as recited in claim 1, wherein the etching is performed anisotropically.

6. A method of fabricating a programmable antifuse structure as recited in claim 1, wherein the etching is performed using a chemical-mechanical planarization process.

7. A method of fabricating a programmable antifuse structure as recited in claim 1, further including the step of depositing a conductive plug material over said first conducting layer and in said via.

8. A method of fabricating a programmable antifuse structure as recited in claim 7 wherein said conducting plug material is formed from tungsten.

9. A method of fabricating a programmable antifuse structure as recited in claim 7 wherein said conducting plug material is formed from aluminum.

10. A method of fabricating a programmable antifuse structure as recited in claim 7 wherein said first conducting layer is formed from a TiN layer over a Ti layer such that the TiN layer prevents silicon diffusion from the field into the conductive plug.

11. A method of fabricating a programmable antifuse structure as recited in claim 1 wherein said first conducting layer is formed from a TiN layer over a Ti layer such that the TiN layer prevents silicon diffusion from the field into the interconnect layer.

12. A method of fabricating a programmable antifuse structure as recited in claim 1 wherein said interlayer is formed from amorphous germanium.

13. A method of fabricating a programmable antifuse structure as recited in claim 1, wherein the interlayer is formed from a material that reacts with the first conducting layer during programming of the programmable antifuse structure.

14. A method of fabricating a programmable antifuse structure as recited in claim 13 wherein said interlayer is formed from a material that forms conductive paths between the field and the first conducting layer during programming of the programmable antifuse structure.

15. A method of fabricating a programmable antifuse structure as recited in claim 14 wherein said interlayer is formed from a material that allows a silicide of the conducting layer to form between the field and the conducting layer.

16. A method of fabricating a programmable antifuse structure as recited in claim 1, further including the step of depositing a plug material over said first conducting layer and in said via, wherein the first conducting layer extends around the plug to electrically couple with the second conducting layer.

17. A method of fabricating a programmable antifuse structure as recited in claim 16 wherein the plug material is non-conductive.

* * * * *

UNITED STATES PATENT AND TRADEMARK OFFICE
CERTIFICATE OF CORRECTION

PATENT NO. : 5,904,507

DATED : May 18, 1999

INVENTOR(S) : Michael E. Thomas

It is certified that error appears in the above-identified patent and that said Letters Patent is hereby corrected as shown below:

Column 5, line 28, replace "suicides" with --silicides--

Signed and Sealed this

Eighth Day of February, 2000

Attest:

Q. TODD DICKINSON

Attesting Officer

*Commissioner of Patents and Trademarks*